United States Patent [19]
Torok

[11] 4,080,591
[45] Mar. 21, 1978

[54] REPLICATOR FOR CROSS-TIE WALL MEMORY SYSTEM INCORPORATING ISOTROPIC DATA TRACK

[75] Inventor: Ernest James Torok, St. Paul, Minn.

[73] Assignee: Sperry Rand Corporation, New York, N.Y.

[21] Appl. No.: 756,303

[22] Filed: Jan. 3, 1977

[51] Int. Cl.$^2$ ............................................ G11C 19/08
[52] U.S. Cl. .................................... 365/171; 365/12
[58] Field of Search .................................. 340/174 TF

[56] References Cited

PUBLICATIONS

AIP Conference on Magnetism & Magnetic Materials, Dec. 9–12, 1975; Phila. Pa., pp. 629–624.

*Primary Examiner*—James W. Moffitt
*Attorney, Agent, or Firm*—Kenneth T. Grace; William E. Cleaver; Marshall M. Truex

[57] ABSTRACT

A plurality of data tracks, each formed of a strip of isotropic magnetic film, i.e., having substantially zero uniaxial anisotropy, are configured into a cross-tie wall memory system. Each of the data-track-defining-strips of isotropic magnetic film utilizes its shape, i.e., its edge contour induced anisotropy, rather than its easy axis magnetic field induced anisotropy, to constrain the cross-tie wall within the planar contour of the film strip. The use of the shape induced anisotropy of the isotropic strip of magnetic film permits the use of nonlinear, i.e., curved, data tracks. The curved data tracks are configured into major loop, minor loop cross-tie wall memory systems that were not permitted by the prior art magnetic field anisotropic magnetic film. The stray field from a cross-tie wall in a minor loop helps to nucleate Néel segments in a Néel wall in the major loop thus replicating data from the minor into the major loop.

9 Claims, 7 Drawing Figures

REPLICATOR FOR CROSS-TIE WALL MEMORY SYSTEM INCORPORATING ISOTROPIC DATA TRACK

The invention described herein was made in the course of, or under, a contract with the Department of the Navy.

BACKGROUND OF THE INVENTION

The propagation of inverted Neel wall sections instead of magnetic bubbles in a serial access memory system was proposed by L. J. Schwee in the publication "Proposal On Cross-Tie Wall and Bloch-line Propagation In Thin Magnetic Films," IEEE Transactions on Magnetics, MAG 8, No. 3, pages 405–407, September 1972. Such a memory system utilizes a ferromagnetic film of 81% Ni – 19% Fe of approximately 350 Angstroms (A) thick in which cross-tie walls can be changed in Neel walls and Neel walls can be changed to cross-tie walls by applying appropriate fields. Associated with the cross-tie walls is a section of inverted Neel wall that is bounded by a cross-tie wall on one end and a Bloch-line on the other end.

In such a cross-tie wall memory system, information is entered at one end of the serial access memory system by the generation of an inverted Neel wall section bounded by a cross-tie on one side and a Bloch-line on the other side that is representative of a stored binary 1 and a non-inverted Neel wall section, i.e., the absence of a cross-tie and Bloch-line pair (that is representative of a stored binary 0, and is moved or propagated along the cross-tie wall by the successive generation) and then the selective annihilation of inverted Neel wall sections at successive memory cells along the cross-tie wall. In the D. S. Lo, et al, U.S. Pat. No. 3,906,466 there is disclosed a propagation circuit for the transfer of inverted Neel wall sections at successive memory cells along the cross-tie wall. In the L. J. Schwee U.S. Pat. No. 3,868,660 and in the publication "Cross-tie Memory Simplified By The Use of Serrated Strips," L. J. Schwee, et al, AIP Conference Proceedings, No. 29, 21st Annual Conference On Magnetism and Magnetic Materials, 1975, published April 1976, pages 624–625 there have been published some more recent results of the further development of cross-tie wall memory systems.

In prior art cross-tie wall memory systems, the magnetic film that functions as the storage medium has the property of uniaxial anisotropy provided by its easy axis induced magnetic fields, which easy axis is generated in the magnetic film during its generation in the vapor deposition process. This easy axis provides a magnetic field induced anisotropy which constrains the generation of the cross-tie wall along and parallel to the easy axis. In the above L. J. Schwee, et al., AIP publication there are proposed serrated strips of Permalloy film, about 350 Angstroms (A) in thickness and 10 microns (μm) in width, which serrated strips are etched from a planar layer of the magnetic material so that the strips are aligned along the easy axis of the film. After an external magnetic field is applied normal to the strip length, i.e., transverse the easy axis of the film, the magnetization along the opposing serrated edges rotates back to the nearest direction that is parallel to the edge. This generates two large domains that are separated by a domain, or cross-tie, wall that is formed along the center line of the strip. Cross-ties are formed at the necks of the serrated edges while Bloch-lines are formed in the potential wells between adjacent necks.

This serrated strip configuration, because of the contour of the opposing edges of the strip, provides the means whereby the cross-tie, Bloch-line pairs are structured at predetermined memory sections along the strip. However, because prior art strips have field induced uniaxial anisotropy imparted during deposition, such strips cannot be utilized to permit the use of nonlinear, i.e., curved, data tracks, which curved data tracks are essential to the configuration of cross-tie wall memory systems of large capacity or of digital logic function capabilities. Accordingly, it is desirable that there be provided a means whereby cross-tie wall memory systems use nonlinear, i.e., curved, data tracks to achieve the desirable characteristics of single wall, e.g., bubble, domain memory systems, such as those of the A. H. Bobeck U.S. Pat. No. 3,729,726 and the D. M. Heinz U.S. Pat. No. 3,735,145, in cross-tie wall memory ststems.

In the copending M. C. Paul, et al. patent application Ser. No. 756,224 filed Jan. 3, 1977 there is disclosed a cross-tie wall memory system and in particular a data track therefor that is formed of a strip of magnetic material having substantially zero magnetic field induced anisotropy. The data-track-defining-strip of isotropic material utilizes its shape, i.e., its edge contour induced, anisotropy to constrain the cross-tie wall within the planar contour and along the centerline of the film strip. Accordingly, the cross-tie wall is constrained to follow the path defined by the magnetic film strip which path may be configured into a major loop, or circular data track, configuration for large capacity memory storage.

SUMMARY OF THE INVENTION

The present invention relates to the utilization of the data-track-defining-strip of isotropic magnetic film of the hereinabove referenced M. C. Paul, et al., patent application to form a replicator of cross-tie, Bloch-line pairs. The replicator is utilized as a magnetic switch or gate to selectively transfer cross-tie, Bloch-line pairs between merging, overlappingdata tracks. This permits the configuration of a plurality of continuous data tracks into a major-loop, minor-loop configuration for a large capacity memory system.

DESCRIPTION OF THE PREFERRED EMBODIMENT

Figure 1:
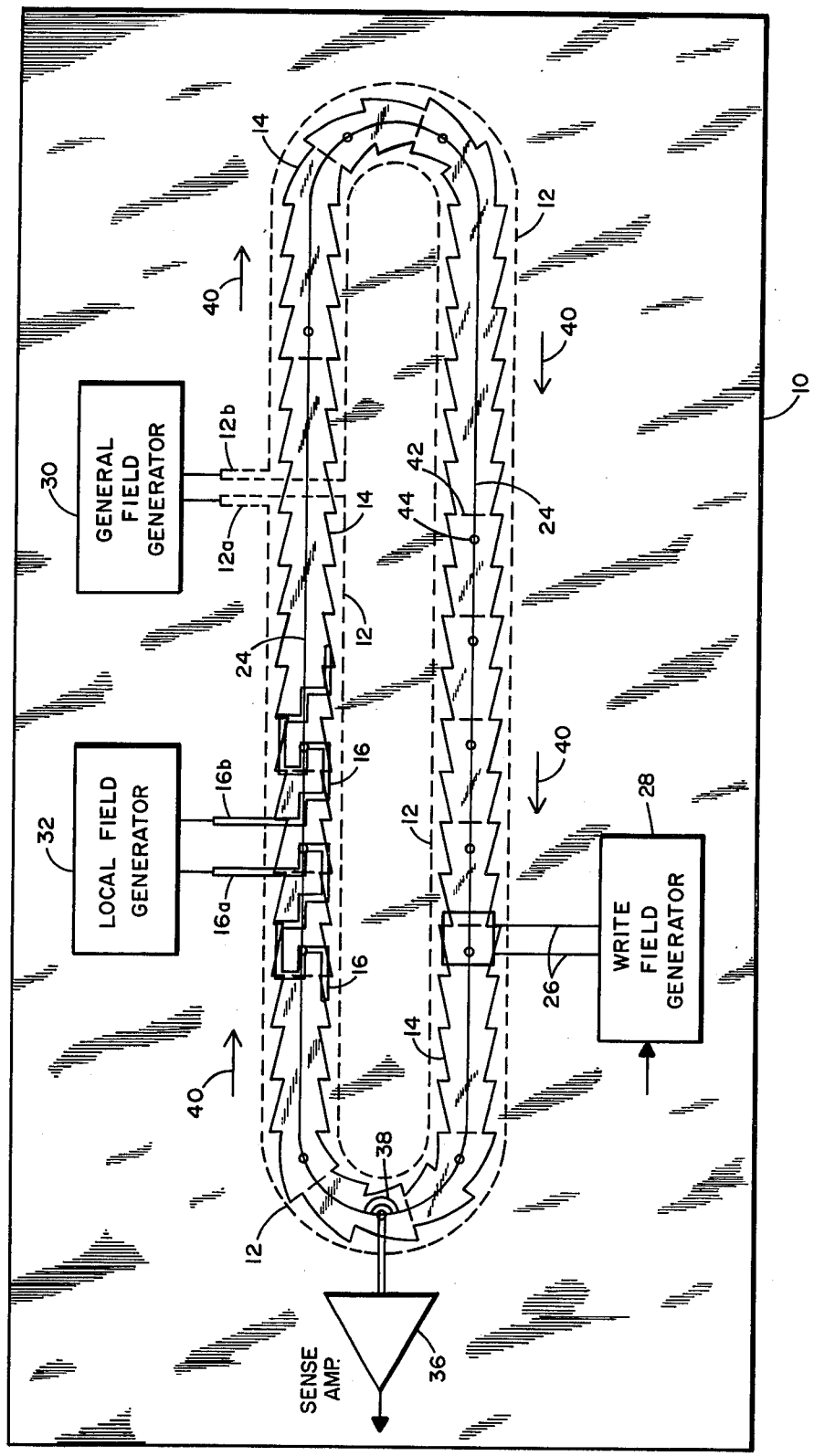
FIG. 1 is a plan view of the cross-tie wall memory system disclosed in the copending patent application of M. C. Paul, et al.
Figure 2:
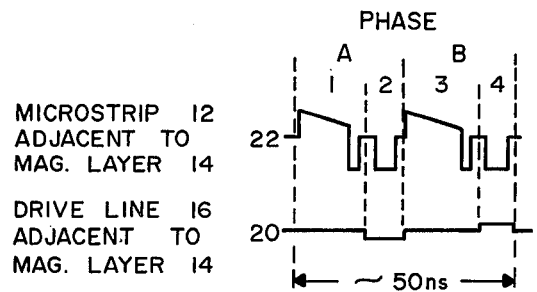
FIG. 2 is an illustration of the waveforms of the signals utilized to propagate the inverted Neel wall sections along the cross-tie wall in the cross-tie wall memory system of FIG. 1.

With particular reference to FIGS. 1 and 2, there are presented illustrations of the cross-tie wall memory system of the copending patent application of M. C. Paul, et al., and the waveforms associated with the operation thereof. In the configuration of FIG. 1 there are illustrated a non-magnetizable, e.g., glass, substrate member 10 having a copper microstrip 12 affixed to its bottom side and a thin ferromagnetic layer 14 affixed to its top side. Affixed to the top side of layer 14 and superposed the microstrip 12 is the copper drive line 16 which is affixed to and superposed the magnetic layer 14 but separated therefrom by an insulative, e.g., SiO or Mylar, member. Drive line 16 consists of a plurality of serially-intercoupled portions, each of which defines a memory cell 1 through N, that are overlaid and uniformly spaced along a cross-tie wall 24 which is also oriented along the longitudinal axis of the superposed copper microstrip 12 and the thin ferromagnetic layer 14.

Superposed the top surface of thin ferromagnetic layer 14 and drive line 16 is a write drive line 26 driven by write field generator 28. Along the top edge of substrate member 10 is general field 22 generator 30 which is coupled across the two end terminals 12a, 12b of copper microstrip 12 for coupling the proper current signal thereto for generating the general field 22 in the area of thin ferromagnetic layer 14. Also located along the top edge of substrate member 10 is local field 20 generator 32 coupled across the two end terminals 16a, 16b of copper drive line 16 for coupling the appropriate current signal thereto for coupling the local field 20 to thin ferromagnetic layer 14. Located at the left-hand curved end of thin ferromagnetic layer 14 is sense amplifier 36 and the associated pickup element 38 for reading out the binary significance of the cross-tie 42, Bloch-line 44 pairs that are generated by write field generator 28 and are serially propagated along cross-tie wall 24 in the direction denoted by arrows 40 by the serially-intercoupled portions of drive line 16, all as discussed in the D. S. Lo, et al., U.S. Pat. No. 3,906,466.

In the prior art operation of a cross-tie wall memory system, as exemplified by the waveforms of FIG. 2, the propagation cycle utilizes two successive phases: phase A (1, 2) and B (3, 4). With an inverted Néel wall section written into the write station at the start of propagation cycle 1, the phase A1 signal generates a new inverted Néel wall section at memory cell 1 that is immediately forward of the inverted Néel wall section at the write station. Next, the phase A2 signals annihilate the inverted Néel wall section at the write station. Next, the phase B3 signal generates a new inverted Néel wall section within memory cell 1 but forward of the inverted Néel wall section generated during phase A1. Lastly, the phase B4 signals annihilate the inverted Néel wall section in memory cell 1 that was generated during phase A2 leaving in memory cell 1 only the inverted Neel wall section that was generated during phase B3. At this time (at the end of propagation cycle 1), the inverted Néel wall section that is representative of a binary 1 that was initially at the write station has been transferred into memory cell 1. If during the next propagation cycle 2, when the inverted Néel wall section in memory cell 1 is to be transferred into memory cell 2, an inverted Néel wall section is to be simultaneously transferred into memory cell 1 from the write station, an inverted Néel wall section must be written into the write station prior to the next subsequent propagation cycle 2 phase A1, otherwise a non-inverted Néel wall section, representative of a binary 0, would be transferred into memory cell 1. This propagation cycle sequence is as disclosed in the above L. J. Schwee publications cited hereinabove.

Figure 4:
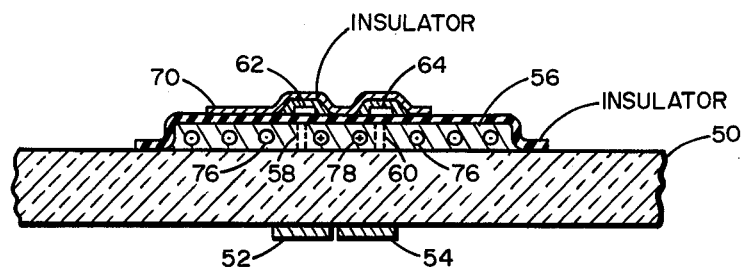
FIG. 4 is an illustration of a cross section of the cross-tie wall memory system of FIG. 3 taken along the line 4—4 thereof illustrating the stacked, superposed elements of FIG. 3 and the magnetic vector representations therein.
Figure 3:
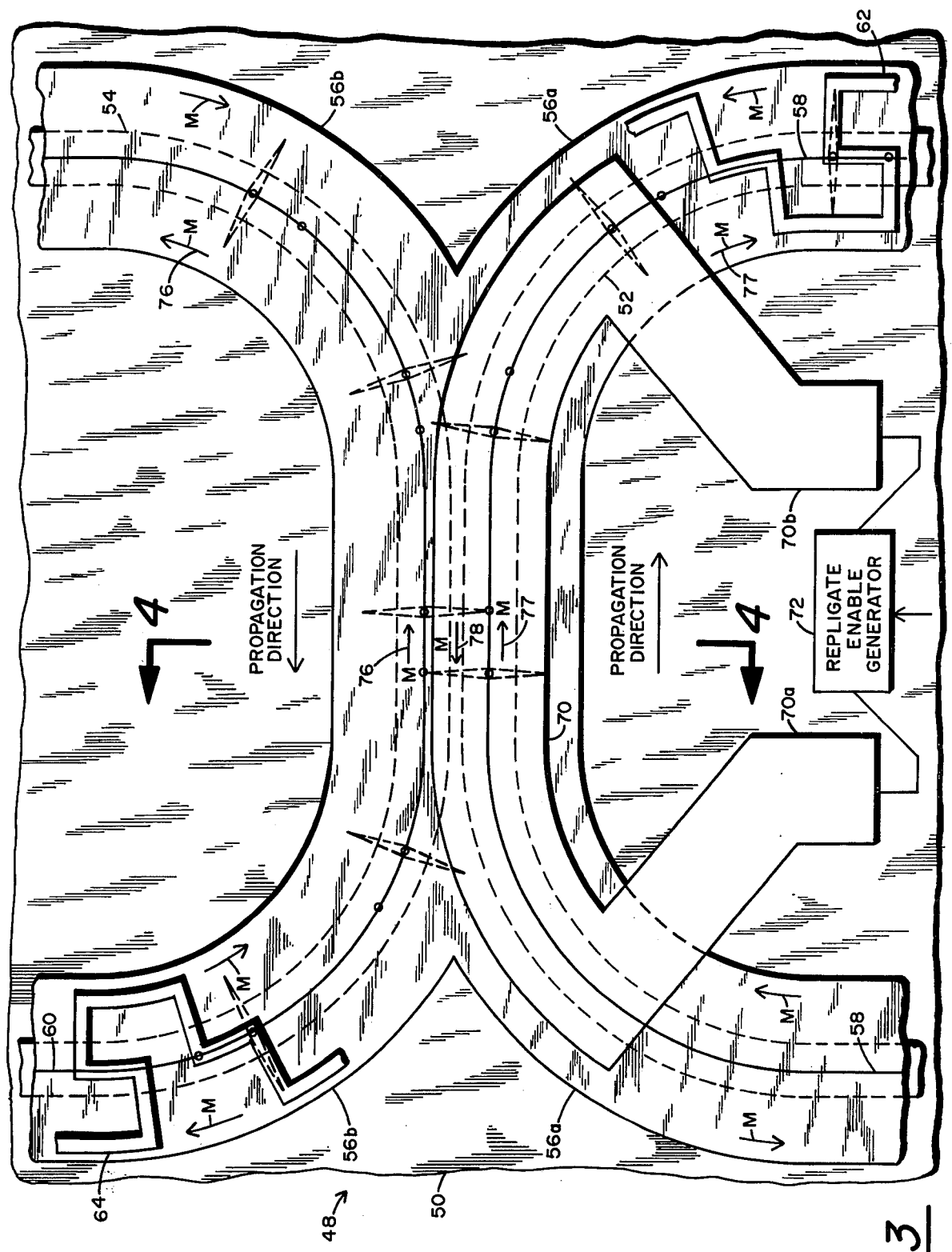
FIG. 3 is a plan view of a portion of a cross-tie wall memory system incorporating the replicator of the present invention.

With particular reference to FIGS. 3, 4, there are presented a plan view of memory plane 48 of a cross-tie wall memory system incorporating the replicator of the present invention and a cross section taken along line 4—4 thereof, respectively. In this configuration, there are illustrated a non-magnetizable, e.g., glass, substrate member 50. Affixed to the bottom side of substrate member 50 are two, electrically insulated, copper microstrips 52 and 54. Affixed to the top side of substrate member 50 is the thin ferromagnetic layer 56 having the two arcuate, merging portions 56a and 56b, which merging portions 56a and 56b are oriented with their longitudinal axes superposed the longitudinal axes of the respectively-associated copper microstrips 52 and 54, respectively. Affixed to the top surface of thin ferromagnetic layer 56 are copper drive line 62, which is associated with and oriented along the longitudinal axis 58 of portion 56a of thin ferromagnetic layer 56, and copper drive line 64, which is oriented along the associated longitudinal axis 60 of portion 56b of thin ferromagnetic film layer 56. Associated with drive lines 62 and 64 are suitable insulative layers for insulating drive line 62 from its associated portion 56a of thin ferromagnetic layer 56 and copper drive line 64 from its associated portion 56b of thin ferromagnetic layer 56. Superposed portion 56a of thin ferromagnetic layer 56 is the arcuate, copper drive line 70, which is superposed longitudinal axis 58 of portion 56a of thin ferromagnetic layer 56, and the two terminal portions 70a and 70b which are, in turn, coupled to replicate enable generator 72. Additionally, there is provided a suitable insulative layer for insulating the copper drive line 70 from the other conductive members of memory plane 48. The cross-tie wall in the center of the portions 56a, 56b may be placed there by any of several well known means such as serrating the edges of the layer 56 such as discussed in the hereinabove referenced L. J. Schwee, et al., AIP publication.

With particular reference to FIG. 4 there is presented an illustration of a cross section of the cross-tie memory plane of FIG. 3 taken along line 4—4 thereof for the purpose of illustrating the stacked, superposed elements of FIG. 3 and the magnetic vector representations thereof. FIG. 4 particularly illustrates the orientation of the magnetization in thin ferromagnetic layer 56 as represented by the vector representations 76, 77 being oriented in an upwardly directed manner out of the plane of the drawing while the magnetization represented by the vector representations 78 illustrate that the magnetization orientations between the adjacent cross-tie walls 58 and 60 are oppositely directed in a downwardly direction into the plane of the drawing.

INTERACTION BETWEEN WALLS

Figure 5:
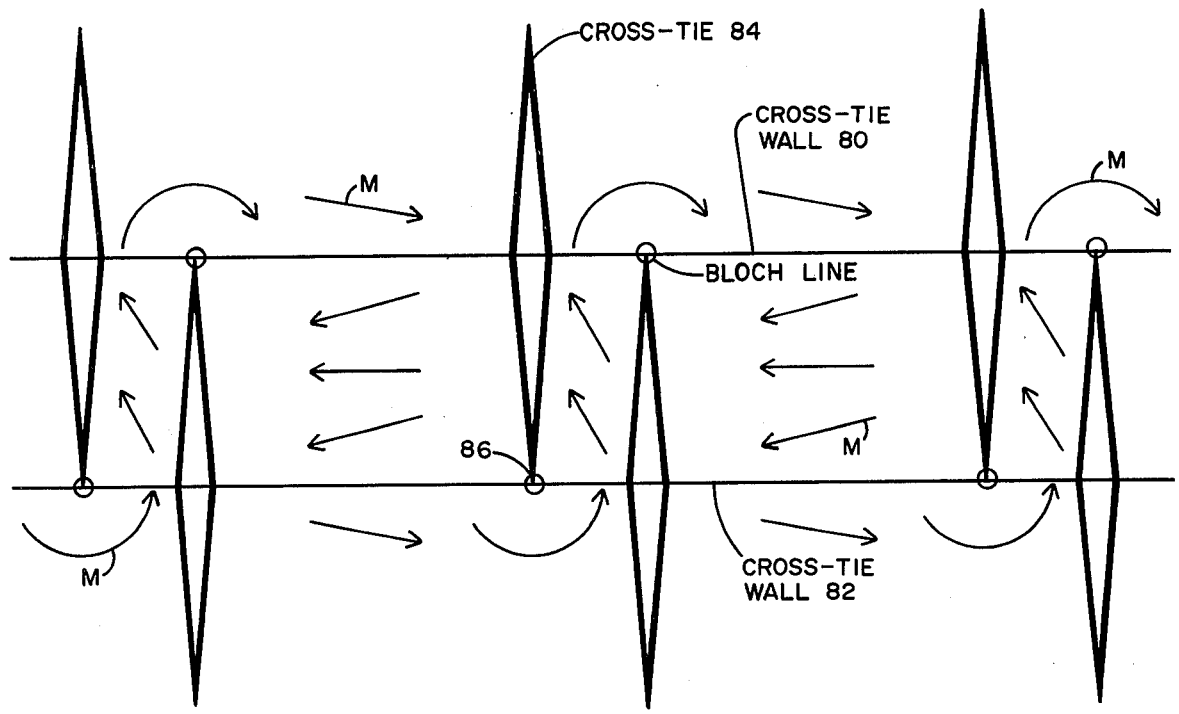
FIG. 5 is a diagramatic illustration of the interaction between cross-ties and Bloch-lines in two adjacent cross-tie walls as illustrated in the embodiment of FIG. 3.

Experiments with Lorentz microscopy show a strong interaction between two adjacent cross-tie walls 80, 82. As shown in FIG. 5, the tip of the cross-tie 84 on cross-tie wall 80 extends to and touches the Bloch-line 86 of the other adjacent cross-tie wall 82. When the Bloch-line of the one cross-tie wall is moved, the cross-tie of the adjacent cross-tie wall bends so that the tip of the cross-tie always touches the Bloch-line. The reason for this can be seen from the magnetization configuration as shown in FIG. 5. The magnetization in the enclosed rectangle forms a magnetic domain. This is pole-avoiding and the lowest energy configuration. The cross-ties of one cross-tie wall join the Bloch-line of the other adjacent cross-tie wall not because of an attraction between cross-tie and Bloch-line, but because of the magnetostatic interaction of the magnetization between the cross-tie walls. In fact, if one of the cross-tie walls is a Neel wall and not a cross-tie wall, there is a stray field from the magnetization surrounding the cross-tie field that tends to aid in the conversion of the Neel wall into a cross-tie wall, as will be discussed with particular reference to FIG. 6.

Figure 6:
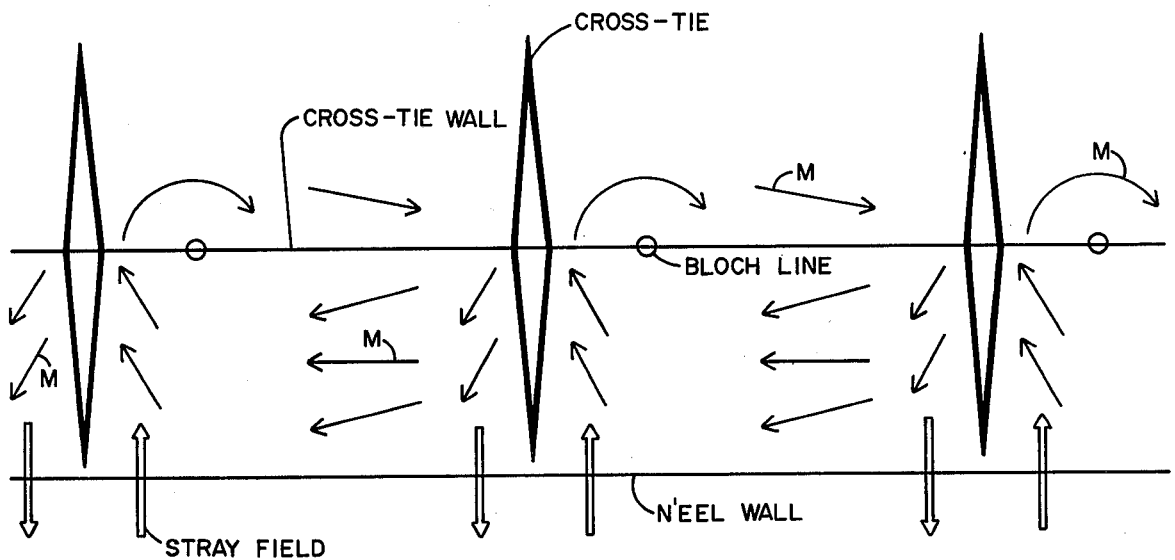
FIG. 6 is a diagramatic illustration of the field on a Neel wall produced by an adjacent cross-tie wall.

The replicator illustrated in FIG. 3 is comprised of two NiFe film strips 56a, 56b each with a domain wall 58, 60 oriented along their centerlines, which film strips intersect at a common portion. The lower strip 56a has a Neel wall 58 in the left-hand, or input, side with no cross-ties. When the conducting strip 70 is pulsed by replicate enable generator 72, each Bloch-line, cross-tie pair in the top strip 56b causes a corresponding Bloch-line, cross-tie pair to be nucleated in the bottom strip 56a. The reason this is so can be seen from FIG. 6: a cross-tie, Bloch-line pair has a sizeable hard axis stray field associated with it that extends a considerable distance from the cross-tie wall. It is this stray field that causes the magnetization between the cross-tie, Bloch-line pair to point at an angle from the shape induced easy axis of the strip 56b. The magnitude of the stray field at any point can be discerned from Lorentz micrographs by measuring this angle; for example, if the shape induced anisotropy of the NiFe film is 4 Oersteds (Oe), and if the angle between the magnetization and the shape induced easy axis is 45° then the hard axis stray field is 0.707(4Oe) = 2.8 Oe. The magnitude of this stray field decreases as the distance from the cross-tie wall increases. FIG. 6 shows the direction of the stray field from a cross-tie wall on an adjacent Neel wall. This stray field can be used to help nucleate a cross-tie, Bloch-line pair in a Néel wall in strip 56a.

Figure 7:
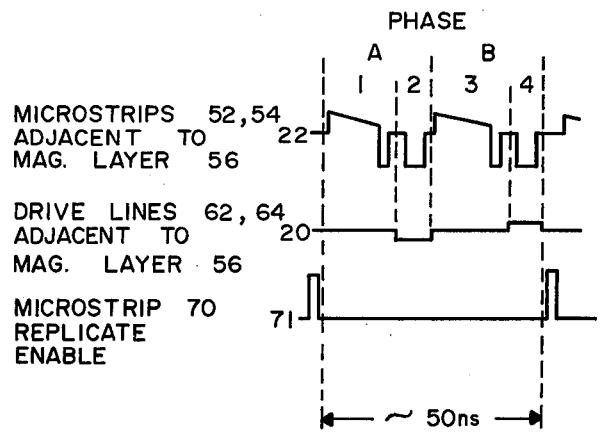
FIG. 7 is an illustration of the waveforms of the signals utilized to replicate the cross-tie, Bloch-line pairs in a second data track as they propagate along a first data track.

A cross-tie, Bloch-line pair can be nucleated in a Néel wall segment by applying a local hard axis field that tends to reverse the magnetization in that Néel wall segment. This fact is generally used to propagate information along a cross-tie wall via cross-tie, Bloch-line pair nucleation and annihilation. See the D. S. Lo, et al., U.S. Pat. No. 3,906,466. In a 350 Angstroms (A) NiFe film, a cross-tie, Bloch-line pair is nucleated when the reverse applied hard axis field exceeds one-fifth the magnitude of the shape induced anisotropy field. Part of the hard axis field that causes cross-tie, Bloch-line pair nucleation should come from the conducting strip line 70; the rest of the hard axis field is provided by the stray field from the cross-tie wall in the strip 56b that is to be replicated in strip 56a. Thus, the conducting strip 70 functions as an enable gate. Note from FIG. 6 that the stray field on the Néel wall is negative in some regions and positive in others; thus, the stray field not only aids in the nucleation of cross-tie, Bloch-line pairs where they are intended to be nucleated, but also aids in the prevention of cross-tie, Bloch-line pairs where they are not intended to be nucleated. Consider an illustrative example; let the two data tracks 56a, 56b, as shown in FIG. 3, be dimensioned so that the magnitude of the stray field on the Néel wall 58 in the left-hand side of track 56a from the cross-tie wall in track 56b be 0.4 Oe. Let the shape induced anisotropy field of the NiFe film be 4 Oe. A reverse hard axis field of 0.8 Oe on the Néel wall is thus required to nucleate a cross-tie, Bloch-line pair. When a replicate enable field 71 of 0.6 Oe is applied per FIG. 7, the total hard axis field at the desired nucleation points is 1 Oe, causing cross-tie, Bloch-line pairs to form; the total hard axis field at the points where cross-tie, Bloch-line pairs are not supposed to be formed is 0.2 Oe and, accordingly, cross-tie, Bloch-line pairs do not form.

Note that when a cross-tie, Bloch-line pair is replicated the Bloch-line is on the opposite side of the cross-tie in the replica, e.g., if the Bloch-line is to the right of the cross-tie in the wall to be replicated, the Bloch-line ends up on the left of the cross-tie in the replica. This leaves the replicated pair in position to be propagated back in the direction opposite to the propagation direction of the original wall, and this permits the configuration of closed data loops. Of course, the propagation direction can be reversed again by a second replication. It is also to be noted that a plurality of, e.g., two or more, cross-tie, Bloch-line pairs may be replicated at the same time by a single replicate enable pulse.

What is claimed is:

1. A replicator for a cross-tie wall memory system in which binary data are stored as cross-tie, Bloch-line pairs in a cross-tie wall in a data-track-defining magnetic film strip and in which said binary data are generated in and are serially propagated along said cross-tie wall in said data track by appropriate drive fields, comprising:

first and second magnetic film strips, each defining first and second data tracks, respectively, and each having a cross-tie wall oriented along its length for supporting cross-tie, Bloch-line pairs, said first and second data tracks having an overlapping, merging portion;

first and second propagating means associated with said first and second data tracks, respectively, for propagating the cross-tie, Bloch-line pairs in said merging portion of said first and second data tracks; and, replicate enable generator means coupling a replicate enable field of a given intensity to said merging portion of said first and second data tracks for generating in said second data track the replica of the cross-tie, Bloch-line pairs in said first data track.

2. The replicator of claim 1 in which:

said first propagating means propagates the cross-tie, Bloch-line pairs in said first data track into, through and out of said merging portion; and, said second propagating means propagates only the replica of the cross-tie, Bloch-line pairs that are in said first data track through and out of said merging portion and along the output portion of said second data track.

3. The replicator of claim 1 in which:

said replicator enable field is of the proper intensity, when added to the intensity of the stray field that is generated by a cross-tie, Bloch-line pair in said first data track merging portion, to replicate said cross-tie, Bloch-line pair that is in said first data track merging portion in said second data track merging portion.

4. The replicator of claim 1 in which:
said first and second propagating means propagate the cross-tie, Bloch-line pairs in said first data track and their replica in said second data track in opposite directions in said merging portion.

5. The replicator of claim 1 in which:
said first and second magnetic film strips are continuous along their lengths.

6. The replicator of claim 1 in which:
said first and second magnetic film strips have edge contours along their opposing edges that structure the positioning of said cross-tie, Bloch-line pairs as they are replicated and propagated along the associated first and second data tracks.

7. The replicator of claim 1 in which:
the first and second cross-tie walls in said first and second data tracks are spaced apart approximately one half cross-tie length in said merging portion.

8. The replicator of claim 1 in which:
said first and second magnetic film strips are formed as one continuous layer.

9. A replicator for a cross-tie wall memory system in which binary data are stored as cross-tie, Bloch-line pairs in a cross-tie wall in a data-track-defining thin ferromagnetic film strip and in which said binary data are generated in and are serially propagated along said cross-tie wall in said data track by appropriate drive fields, comprising:

first and second continuous thin ferromagnetic film strips, each defining first and second data tracks, respectively, and each having a cross-tie wall oriented along its length for supporting cross-tie, Bloch-line pairs, said first and second data tracks having an overlapping, merging portion in which said first and second cross-tie walls are spaced apart approximately one half cross-tie length;

first and second structuring means associated with said first and second data tracks for structuring the positioning of said cross-tie, Bloch-line pairs along said first and second data tracks, respectively;

first and second propagating means associated with said first and second data tracks, respectively, for propagating the cross-tie, Bloch-line pairs in said merging portion of said first and second data tracks in opposite directions, but at a similar propagation frequency $F_p$; and replicate enable generator means coupling a replicate enable field of a given intensity to said merging portion of said first and second data tracks for generating in said second data track the replica of the cross-tie, Bloch-line pairs in said first data track at said propagation frequency $F_p$.

* * * * *